(12) United States Patent
Cheng et al.

(10) Patent No.: US 12,386,786 B2
(45) Date of Patent: Aug. 12, 2025

(54) DATA PROCESSING METHOD AND APPARATUS

(71) Applicant: HUAWEI TECHNOLOGIES CO., LTD., Guangdong (CN)

(72) Inventors: Zhen Cheng, Shanghai (CN); Zengshi Huang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/505,547

(22) Filed: Nov. 9, 2023

(65) Prior Publication Data

US 2024/0070120 A1    Feb. 29, 2024

Related U.S. Application Data

(63) Continuation of application No. PCT/CN2022/075263, filed on Jan. 30, 2022.

(30) Foreign Application Priority Data

May 10, 2021   (CN) .......................... 202110503944.0

(51) Int. Cl.
   *G06F 16/174*   (2019.01)
   *G06F 7/08*   (2006.01)

(52) U.S. Cl.
   CPC ............ *G06F 16/1744* (2019.01); *G06F 7/08* (2013.01)

(58) Field of Classification Search
   CPC ................... G06F 16/1744; G06F 7/08; G06F 2212/1024; G06F 2212/1044; G06F 2212/261; G06F 2212/401; G06F 3/0608; G06F 3/064; G06F 3/0641; G06F 3/067; G06F 12/08; G06F 16/00; G06F 3/0611; G06F 16/174; G06F 3/0688; G06F 12/0238; H03M 7/3077; H03M 7/6047
   See application file for complete search history.

(56) References Cited

U.S. PATENT DOCUMENTS

| | | | |
|---|---|---|---|
| 8,478,731 B1 | 7/2013 | Throop et al. | |
| 10,116,329 B1* | 10/2018 | Bigman | ............... G06F 3/0608 |
| 2009/0300015 A1* | 12/2009 | Kazan | ...................... H03M 7/30 |
| 2018/0074723 A1* | 3/2018 | Delaney | .................. G06F 3/067 |

OTHER PUBLICATIONS

Office Action in European Appln. No. 22806222.0, mailed on Sep. 10, 2024, 8 pages.

* cited by examiner

*Primary Examiner* — Tyler J Torgrimson

(74) *Attorney, Agent, or Firm* — Fish & Richardson P.C.

(57) ABSTRACT

In one example method, a server obtains compressed data, where the compressed data includes at least a first part and a second part, and where the compressed data is sorted based on popularity values of parts of the compressed data, and a popularity value of a part of the compressed data is greater than a popularity value of a subsequent part of the compressed data. The server decompresses the first part, and decompresses the second part after decompressing the first part, where a popularity value of the first part is greater than a popularity value of the second part.

20 Claims, 11 Drawing Sheets

DATA PROCESSING METHOD AND APPARATUS

CROSS-REFERENCE TO RELATED APPLICATIONS

This application is a continuation of International Application No. PCT/CN2022/075263, filed on Jan. 30, 2022, which claims priority to Chinese Patent Application No. 202110503944.0, filed on May 10, 2021. The disclosures of the aforementioned applications are hereby incorporated by reference in their entireties.

TECHNICAL FIELD

This application relates to the field of computer technologies, and in particular, to a data processing method and apparatus.

BACKGROUND

Currently, new computer data generated every day and massive inventory data in the world bring higher storage efficiency and storage resource requirements. Therefore, a data reduction technology is developed and matured.

A principle of the data reduction technology may be understood as that frequently used data may be replaced with short code, and each piece of data has different code. Based on the principle, repeated data in a plurality of to-be-compressed objects may be compressed, to reduce storage space occupied by the plurality of objects.

Common data reduction technologies include combination compression and delta compression. FIG. 1 is a schematic flowchart of combination compression. As shown in FIG. 1, a process of the combination compression may include: identifying a plurality of similar objects in a manner of similar fingerprints, and combining the plurality of similar objects. Each object includes a plurality of bytes. For example, each object may be scanned by using a byte as a granularity. If subsequent data (byte) is repeated with previous data (byte), the subsequent data may be replaced with code corresponding to the previous data. Differences between the delta compression and the combination compression lie in that, in the delta compression, a standard object is selected from a plurality of similar objects, each of the remaining objects is compared with the standard object, data different from data in the standard object is retained, and data that is repeated with the data in the standard object is compressed. Therefore, storage space occupied by the plurality of objects is reduced.

The data reduction technology is widely used because the data reduction technology can effectively save storage space. However, in the foregoing process of the combination compression, it can be learned that there is specific association between compressed data and data obtained through compression in the combination compression. Consequently, when data obtained based on combination compression needs to be decompressed, the data needs to be decompressed as a whole, in other words, read amplification is caused. For example, when a last object is decompressed, all objects before the last object need to be decompressed, and the compressed data is found in the previous object based on code in the last object, to restore the compressed data to the last object. The read amplification may also be understood as that data of n bytes needs to be read, but an amount of data greater than n bytes is read.

Due to a limitation of a constraint condition such as input/output operations per second (IOPS), the problem of read amplification also exists when data obtained based on delta compression is decompressed. The IOPS is a quantity of times of performing read I/Os per second. For example, when the $8^{th}$ object is read based on the data obtained based on delta compression, an implementable decompression manner is to provide a start address and a length of a standard object and a start address and a length of the $8^{th}$ object, and separately decompress the two objects. In this manner, a quantity of read I/Os is 2. In another implementable decompression manner, a length from a start address of a standard object to the $8^{th}$ object may be provided. In this manner, a quantity of read I/Os is 1. Generally, compared with a manner of decompressing eight objects as a whole, a manner of separately decompressing (reading) two objects, in other words, compared with a case that the IOPS is 1, when the IOPS is 2, more resources such as scheduling and computing resources are consumed. In this case, for the data obtained based on delta compression, the data is usually decompressed as a whole. Consequently, problems such as the read amplification and high read bandwidth overheads caused by the read amplification exist.

SUMMARY

This application provides a data processing method and apparatus, to reduce data decompression overheads while ensuring storage resource utilization.

According to a first aspect, an embodiment of this application provides a data processing method. The method may be performed by a server. In the method, the server may first obtain compressed data, for example, may obtain the compressed data from a storage medium of the server, or may receive the compressed data from another device. The compressed data includes at least two parts: a first part and a second part. When the compressed data is decompressed, the first part is first decompressed, and then the second part is decompressed. A popularity value of the first part is greater than a popularity value of the second part.

According to the method provided in the first aspect, when the server decompresses the compressed data, because the first part is sorted before the second part, the popularity value of the first part is greater than the popularity value of the second part, and a probability of accessing the first part is relatively high, a read amplification ratio of decompressing the first part can be reduced, and an amplification ratio of decompressing the second part is approximately the same as that of an existing compression manner. Therefore, an average read amplification ratio of the server is reduced.

In a possible design, the popularity value of the first part indicates frequency and/or time at which data included in the first part is accessed, and the popularity value of the second part indicates frequency and/or time at which data included in the second part is accessed.

In a possible design, the server includes at least a primary memory and a secondary memory. Performance of the primary memory is higher than performance of the secondary memory. For example, the primary memory is a dynamic random access memory (DRAM), and the secondary memory is a storage-class storage (SCM). For another example, the primary memory is a solid-state drive (SSD), and the secondary memory is a hard disk drive (HDD). For yet another example, the primary memory is an SCM, and the secondary memory is an SSD. The first part of the compressed data is stored in the primary memory, and the second part of the compressed data is stored in the secondary memory.

In the foregoing method, grading storage of cold and hot data can be implemented, and storage resource overheads of a high-performance layer can be further reduced on the basis of reducing an average read amplification ratio of a server, thereby reducing costs and improving system performance.

According to a second aspect, an embodiment of this application provides a data processing method. The method may be performed by a server. In the method, the server may first obtain a plurality of to-be-compressed objects, where the objects are, for example, data blocks, and may be obtained from a storage medium such as an internal memory or a hard disk of the server. Then, a popularity value of each object is determined, and the plurality of objects are sorted in descending order of popularity values. Finally, the plurality of sorted objects are compressed to obtain compressed data, and in the compressed data, data in an object having a high popularity value is sorted before data in an object having a low popularity value.

According to the method provided in the second aspect, before compressing the plurality of objects, the server sorts the objects in descending order based on the popularity values of the objects. In this way, because an object having a high popularity value, that is, frequently read hotspot data is sorted ahead, a read amplification ratio is reduced when the data is decompressed. In addition, because an object having a low popularity value, that is, cold data is read less, an amplification ratio is approximately the same as that of an existing compression manner. Therefore, an average read amplification ratio of the server is reduced.

In a possible design, in a process of combining the plurality of objects, the server may synchronously sort the plurality of objects in descending order of the popularity values, to enable the combined plurality of objects to be continuously stored in a segment of target storage space in descending order of the popularity values.

In the foregoing method, if an initial storage space of the plurality of objects is discontinuous, the plurality of objects may be combined. In this way, obtained compressed data is also continuous. This facilitates decompression. Further, the objects may be migrated based on sorting of popularity values in a combination process, to reduce resource overheads.

In a possible design, a similarity between every two objects in the plurality of objects exceeds a preset threshold. Optionally, the similarity is determined by using similar fingerprints of the objects.

In the foregoing method, a higher similarity indicates more data that may be repeated between two objects, and a higher reduction rate.

In a possible design, the server includes at least a primary memory and a secondary memory. Performance of the primary memory is higher than performance of the secondary memory. For example, the primary memory is a DRAM, and the secondary memory is an SCM. For another example, the primary memory is an SSD, and the secondary memory is an HDD. For yet another example, the primary memory is an SCM, and the secondary memory is an SSD.

The server may store, in the primary memory, a part that is in the compressed data and whose popularity value exceeds a first preset threshold; and store, in the secondary memory, a part that is in the second data and whose popularity value is less than a second preset threshold.

In the foregoing method, grading storage of cold and hot data can be implemented, and storage resource overheads of a high-performance layer can be further reduced on a basis of reducing an average read amplification ratio of a server, thereby reducing costs and improving system performance.

According to a third aspect, an embodiment of this application provides a data processing apparatus. The apparatus includes: an obtaining module, configured to obtain compressed data, where the data includes at least a first part and a second part; a decompression module, configured to decompress the first part, and the decompression module decompresses the second part after decompressing the first part, where a popularity value of the first part is greater than a popularity value of the second part.

In a possible design, the popularity value of the first part indicates frequency and/or time at which the first part is accessed, and the popularity value of the second part indicates frequency and/or time at which the second part is accessed.

In a possible design, the apparatus includes at least a primary memory and a secondary memory. Performance of the primary memory is higher than performance of the secondary memory. The first part is stored in the primary memory, and the second part is stored in the secondary memory.

According to a fourth aspect, an embodiment of this application provides a data processing apparatus. The apparatus includes: an obtaining module, configured to obtain a plurality of to-be-compressed objects; a determining module, configured to determine a popularity value of each object; and a sorting module, configured to sort the plurality of objects in descending order of popularity values, and compress the plurality of sorted objects.

In a possible design, the sorting module is further configured to combine the plurality of objects, to enable the combined plurality of objects to be continuously stored in a segment of target storage space in descending order of the popularity values.

In a possible design, a similarity between every two objects in the plurality of objects exceeds a preset threshold.

In a possible design, the similarity is determined by using similar fingerprints of the objects.

In a possible design, the apparatus includes at least a primary memory and a secondary memory, where performance of the primary memory is higher than that of the secondary memory. The apparatus further includes a grading module, where the grading module is configured to store, in the primary memory, a part that is in compressed data and whose popularity value exceeds a first preset threshold, and store, in the secondary memory, a part that is in the second data and whose popularity value is less than a second preset threshold.

According to a fifth aspect, a storage apparatus is provided, where the apparatus includes a processor and a memory, and the memory is configured to store program instructions and data. The memory is coupled to the processor, and the processor may invoke and execute the program instructions stored in the memory, to implement any method in the methods described in the first aspect, or implement any method in the methods described in the second aspect.

According to a sixth aspect, an embodiment of this application provides a computer-readable storage medium. The computer-readable storage medium stores a computer program, and the computer program includes program instructions. When the program instructions are executed by a computer, the computer is enabled to perform the method according to any possible design of the first aspect or the method according to any possible design of the second aspect.

According to a seventh aspect, an embodiment of this application provides a computer program product. The computer program product stores a computer program, and the computer program includes program instructions. When the program instructions are executed by a computer, the computer is enabled to perform the method according to any possible design of the first aspect or the method according to any possible design of the second aspect.

According to an eighth aspect, this application provides a chip system. The chip system includes a processor and a memory, and is configured to implement the method according to the first aspect, or is configured to implement the method according to the second aspect. The chip system may include a chip, or may include a chip and another discrete device.

For beneficial effects of the third aspect to the eighth aspect and the implementations of the third aspect to the eighth aspect, refer to the descriptions of beneficial effects of the method in the first aspect and the implementations of the first aspect, or the descriptions of beneficial effects of the method in the second aspect and the implementations of the second aspect.

DESCRIPTION OF EMBODIMENTS

A data processing method in this application is applicable to a plurality of application scenarios. For example, the data processing method in this application may be applied to a data storage scenario. When a server (which may also be a controller or a computing node) obtains a plurality of to-be-compressed objects and needs to store the plurality of objects, to reduce storage space occupied by the plurality of objects, the plurality of objects may be compressed in a data compression manner in the data processing method in this application, to generate compressed data, and the compressed data is stored in an internal memory or a hard disk.

For another example, the method may be applied to a data exchange scenario. In the data exchange scenario, for a first device and a second device that perform data exchange, the first device may compress the plurality of objects in the data compression manner in the data processing method in this application, to generate compressed data. The first device may send the compressed data to the second device. After receiving the compressed data, the second device may store the compressed data, or may decompress the compressed data in the data decompression manner in the data processing method in this application.

Figure 1:
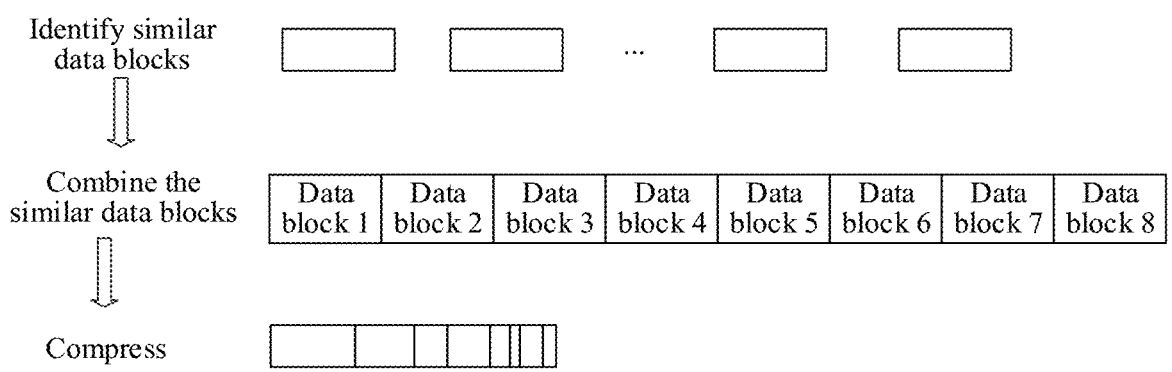
FIG. 1 is a schematic diagram of a scenario of combination compression.
Figure 2A:
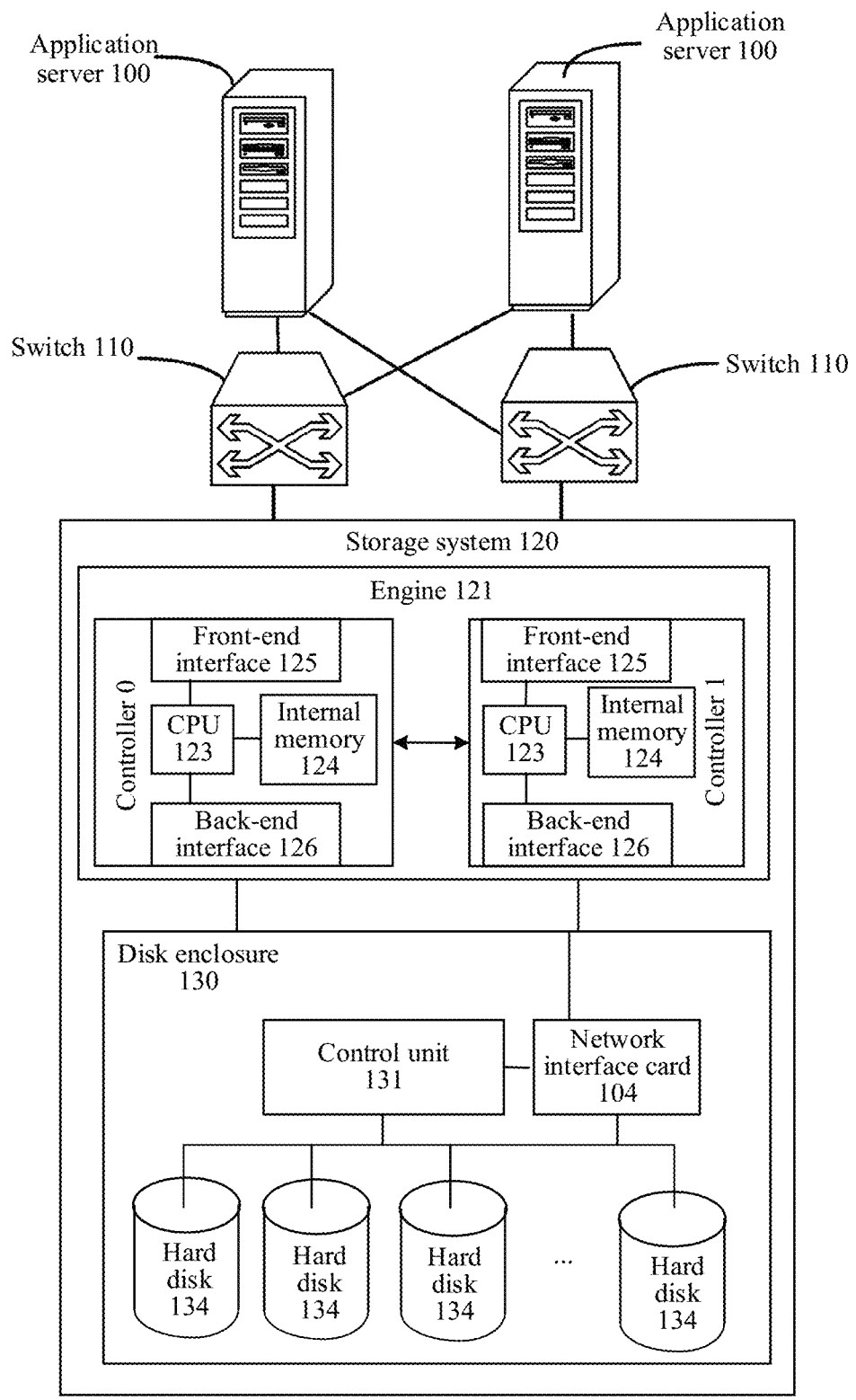
FIG. 2A to FIG. 2E are schematic diagrams of a system architecture according to an embodiment of this application.

The following uses a system architecture applicable to the data storage scenario as an example for description. FIG. 2A is a schematic diagram of a system architecture according to an embodiment of this application. The system architecture includes an application server 100, a switch 110, and a storage system 120.

A user accesses data through applications. A computer running these applications is called an "application server". The application server 100 may be a physical machine, or may be a virtual machine. The physical application server includes but is not limited to a desktop computer, a server, a notebook computer, and a mobile device. The application server accesses a storage system through the fiber channel switch 110 to access data. However, the switch 110 is only an optional device, and the application server 100 may also directly communicate with the storage system 120 through a network.

The storage system 120 shown in FIG. 2A is a centralized storage system. A feature of the centralized storage system is that there is a unified entry, and all data from an external device needs to pass through the entry. The entry is an engine 121 of the centralized storage system. The engine 121 is a core component in the centralized storage system, and many advanced functions of the storage system are implemented in the engine 121.

As shown in FIG. 2A, the engine 121 has one or more controllers. An example in which the engine includes two controllers is used for description in FIG. 2A. There is a mirror channel between a controller 0 and a controller 1. After writing one part of data into an internal memory 124 of the controller 0, the controller 0 may send a copy of the data to the controller 1 through the mirror channel, and the controller 1 stores the copy in an internal memory 124 of the controller 1 locally. Therefore, the controller 0 and the controller 1 provide mutual backup. When the controller 0 is faulty, the controller 1 may take over a service of the controller 0. When the controller 1 is faulty, the controller 0 may take over a service of the controller 1. This avoids unavailability of the entire storage system 120 caused by a hardware fault. When four controllers are deployed in the engine 121, a mirror channel exists between any two controllers, and therefore the any two controllers provide mutual backup.

The engine 121 further includes a front-end interface 125 and a back-end interface 126. The front-end interface 125 is configured to communicate with the application server 100, to provide a storage service for the application server 100. The back-end interface 126 is configured to communicate with hard disks 134, to expand a capacity of the storage system. Through the back-end interface 126, the engine 121 may be connected to more hard disks 134, to form a very large storage resource pool.

The controller 0 may perform the data processing method provided in embodiments of this application. In terms of hardware, as shown in FIG. 2A, the controller 0 includes at least a processor 123 and an internal memory 124.

The processor 123 is a central processing unit (CPU), is configured to process a data access request from outside of a storage system (a server or another storage system), and is also configured to process a request generated inside the storage system. For example, when receiving, through the front-end interface 125, data write requests sent by the application server 100, the processor 123 temporarily stores data in the data write requests in the internal memory 124. When a total amount of data in the internal memory 124 reaches a specific threshold, the processor 123 sends, through the back-end port, the data stored in the internal memory 124 to the hard disks 134 for persistent storage.

The internal memory 124 is an internal memory that directly exchanges data with the processor 123. The internal memory 124 can read and write data at any time at a high speed. The internal memory 124 is used as a temporary data memory of an operating system or another running program. The internal memory includes at least two types of memories. For example, the internal memory may be a random access memory, or may be a read-only memory (ROM). For example, the random access memory is a dynamic random access memory (DRAM), or a storage-class memory (SCM). The DRAM is a semiconductor memory, which is a volatile memory device like most random access memories (RAMs). The SCM is a composite storage technology that combines features of both a conventional storage apparatus and a memory. The storage-class memory can provide a higher read/write speed than a hard disk, but has a slower computing speed than a DRAM, and is cheaper than the DRAM in terms of costs. However, the DRAM and the SCM are merely examples for description in this embodiment, and the internal memory may further include another random access memory, for example, a static random access memory (SRAM). The read-only memory, for example, may be a programmable read-only memory (PROM), or an erasable programmable read-only memory (EPROM). In addition, the internal memory 124 may also be a dual in-line memory module or a dual in-line memory module (DIMM), that is, a module formed by a dynamic random access memory (DRAM), and may also be a solid-state drive/solid-state disk (SSD) having a memory access interface. In actual application, a plurality of internal memories 124 of a same type and internal memories 124 of different types may be configured in the controller 0. A quantity and types of the internal memories 124 are not limited in this embodiment. In addition, the internal memory 124 may be configured to have a power-off protection function. The power-off protection function means that when a system is powered off and then powered on again, data stored in the internal memory 124 is not lost. An internal memory having a power-off protection function is referred to as a non-volatile memory.

The internal memory 124 stores a software program, and the processor 123 may manage a hard disk by running the software program in the internal memory 124. For example, the hard disk is abstracted into a storage resource pool and then is divided into LUNs for servers to use. The LUNs here are actually the hard disks seen on the server. Optionally, some centralized storage systems are also file servers, and may provide file sharing services for the servers.

Hardware components and software structures of the controller 1 (and other controllers that are not shown in FIG. 2A) are similar to those of the controller 0, and details are not described herein again.

FIG. 2A shows a centralized storage system with disk and controller separation. In the system, the engine 121 may not have a disk slot, the hard disks 134 need to be placed in a disk enclosure 130, and the back-end interfaces 126 communicate with the disk enclosure 130. The back-end interfaces 126 exist in the engine 121 in a form of an adapter card. One engine 121 may simultaneously use two or more back-end interfaces 126 to connect a plurality of disk enclosures. Alternatively, the adapter card may also be integrated on a mainboard, and in this case, the adapter card may communicate with the processor 123 through a PCIE bus.

Figure 2B:
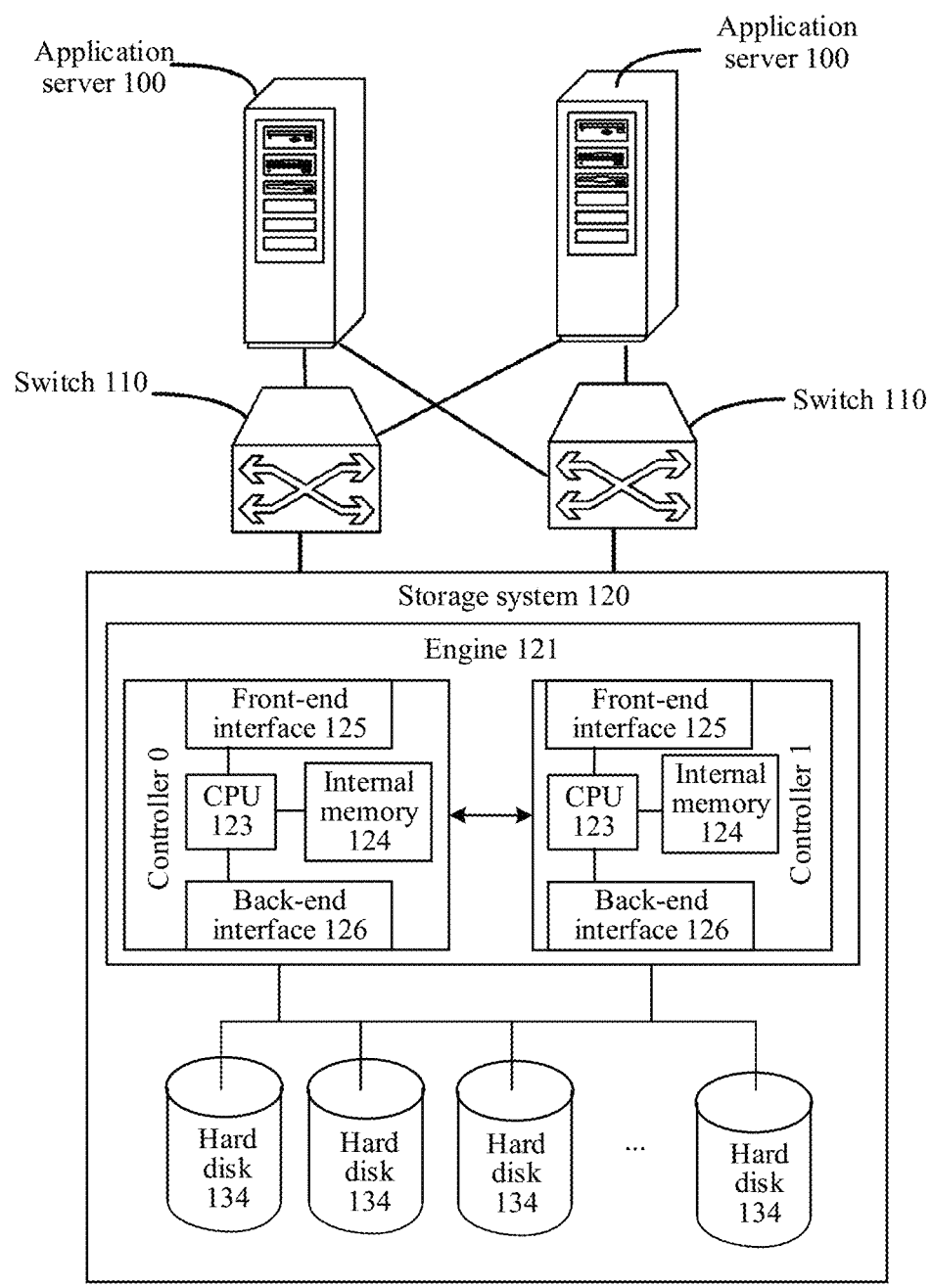

FIG. 2B is a schematic diagram of another system architecture according to an embodiment of this application. The system architecture includes an application server 100, a switch 110, and a storage system 120. The system architecture shown in FIG. 2B is similar to the system architecture shown in FIG. 2A. A difference lies in that a disk enclosure is omitted in the system architecture shown in FIG. 2B, and a controller is directly connected to each hard disk 134.

Figure 2C:
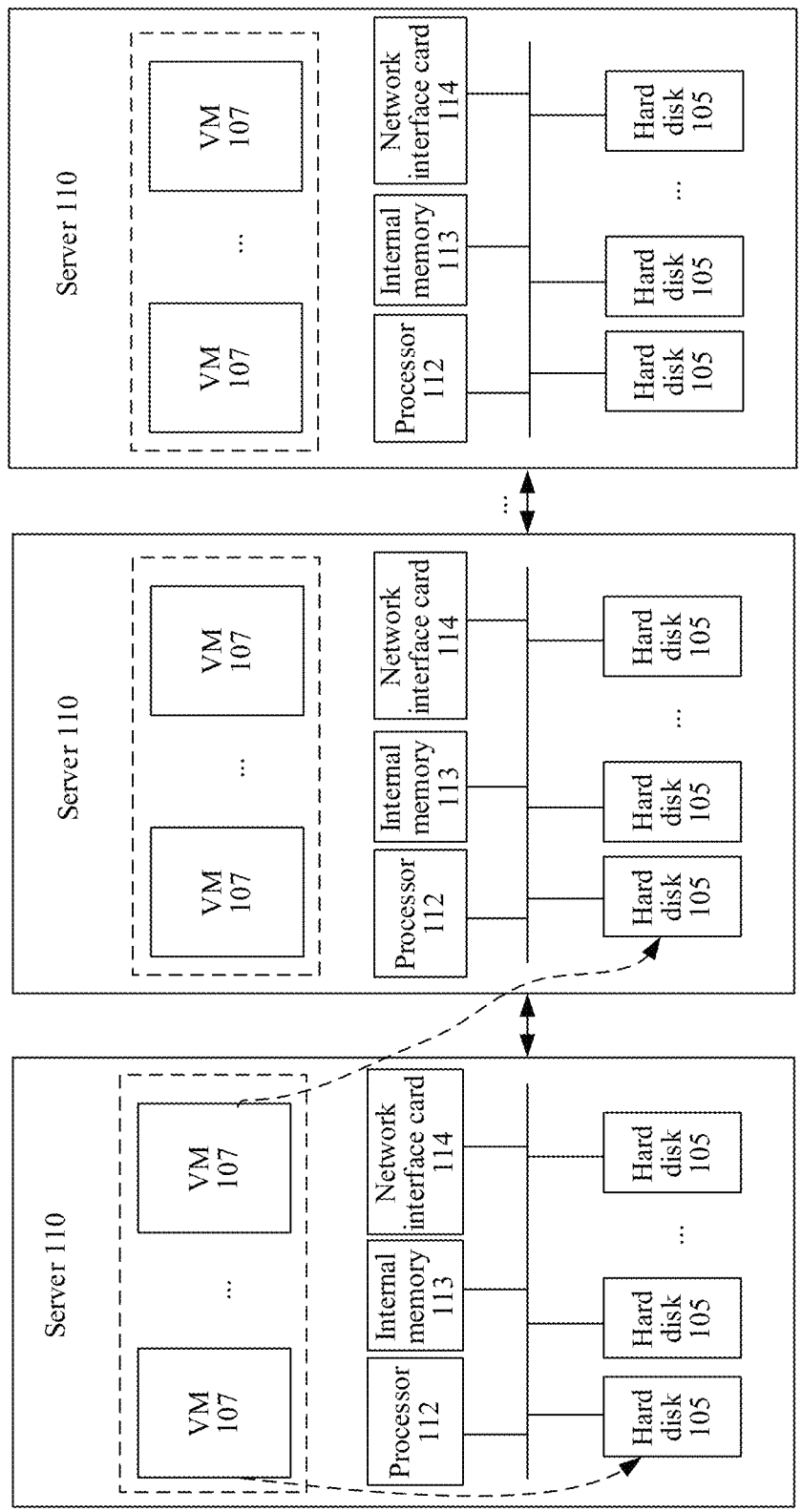

The data processing method provided in this embodiment of this application is also applicable to a distributed storage system in addition to a centralized storage system. FIG. 2C is a schematic diagram of a system architecture of a distributed storage system according to an embodiment of this application. The distributed storage system includes a server cluster. The server cluster includes one or more servers 110 (three servers 110 are shown in FIG. 2C, but this application is not limited to the two servers 110), and the servers 110 may communicate with each other. The server 110 is a device that has both a computing capability and a storage capability, for example, a server or a desktop computer. In terms of software, each server 110 has an operating system. A virtual machine 107 may be created on the server 110. A computing resource required by the virtual machine 107 comes from a local processor 112 and a local internal memory 113 of the server 110. A storage resource required by the virtual machine 107 may come from local hard disks 105 of the server 110, or may come from hard disks 105 of another server 110. In addition, various application programs may be run in the virtual machine 107, and a user may trigger a data read/write request by using the application programs in the virtual machine 107.

The server 110 may perform the data processing method provided in embodiments of this application. In terms of hardware, as shown in FIG. 2C, the server 110 includes at least a processor 112, an internal memory 113, a network interface card 114, and hard disks 105. The processor 112, the internal memory 113, the network interface card 114, and the hard disks 105 are connected through a bus. The processor 112 and the internal memory 113 are configured to provide computing resources. Specifically, the processor 112 is a central processing unit (CPU), and is configured to process a data access request from outside of the server 110 or a request generated inside the server 110. In addition, the processor 112 is further configured to perform calculation or processing on data, for example, metadata management, data compression, data verification, storage space virtualization, and address translation. FIG. 2C shows only one CPU 112. In actual application, there are generally a plurality of CPUs 112, and one CPU 112 has one or more CPU cores. A quantity of CPUs and a quantity of CPU cores are not limited in this embodiment.

A function and a type of the internal memory 113 are the same as those of the internal memory 124. For details, refer to the foregoing descriptions. Details are not described herein again. The hard disk 105 is configured to provide a storage resource, for example, storage data, and may be a magnetic disk or another type of storage medium, for example, a solid-state drive or a shingled magnetic recording hard disk. The network interface card 114 is configured to communicate with another server 110.

Figure 2D:
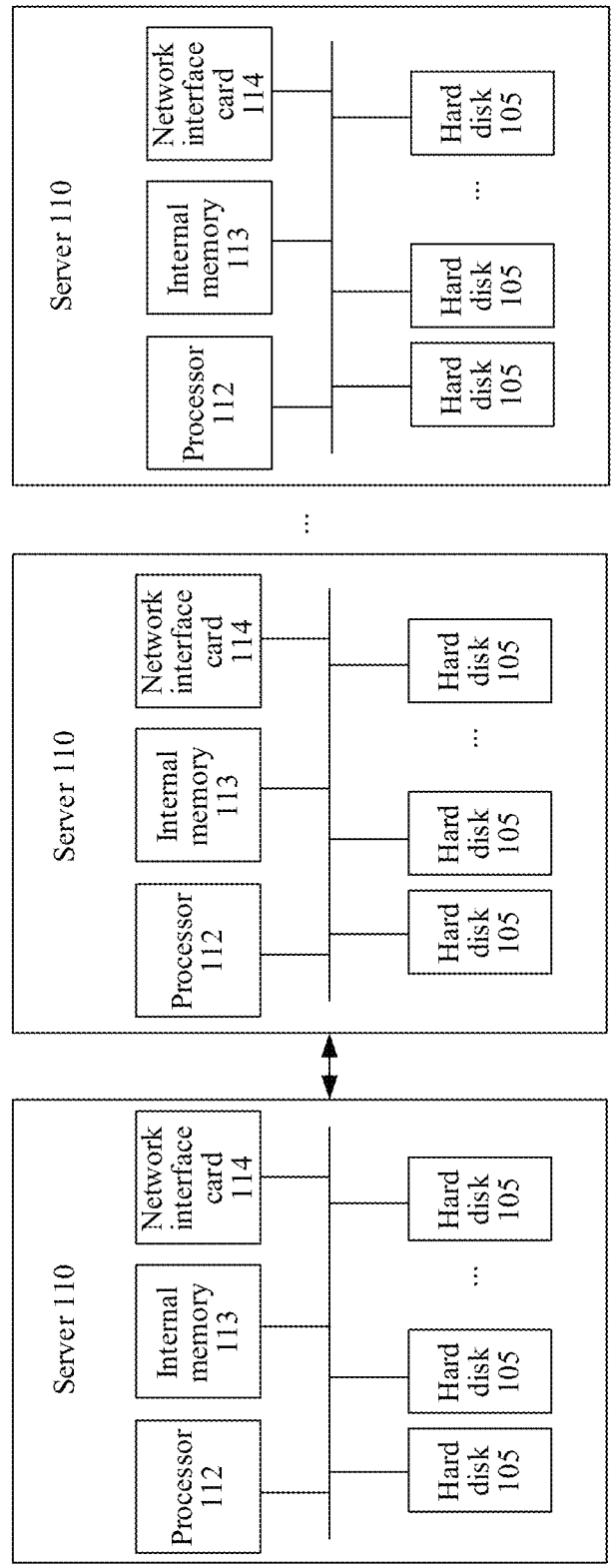

FIG. 2D is a schematic diagram of a system architecture of another distributed storage system according to an embodiment of this application. The system architecture shown in FIG. 2C is similar to the system architecture shown in FIG. 2D. A difference lies in that no virtual machine is deployed on the server 110 in the system architecture shown in FIG. 2D, and a user may initiate a data read request or a data write request to the server 110 by using a device deployed outside the server 110.

Figure 2E:
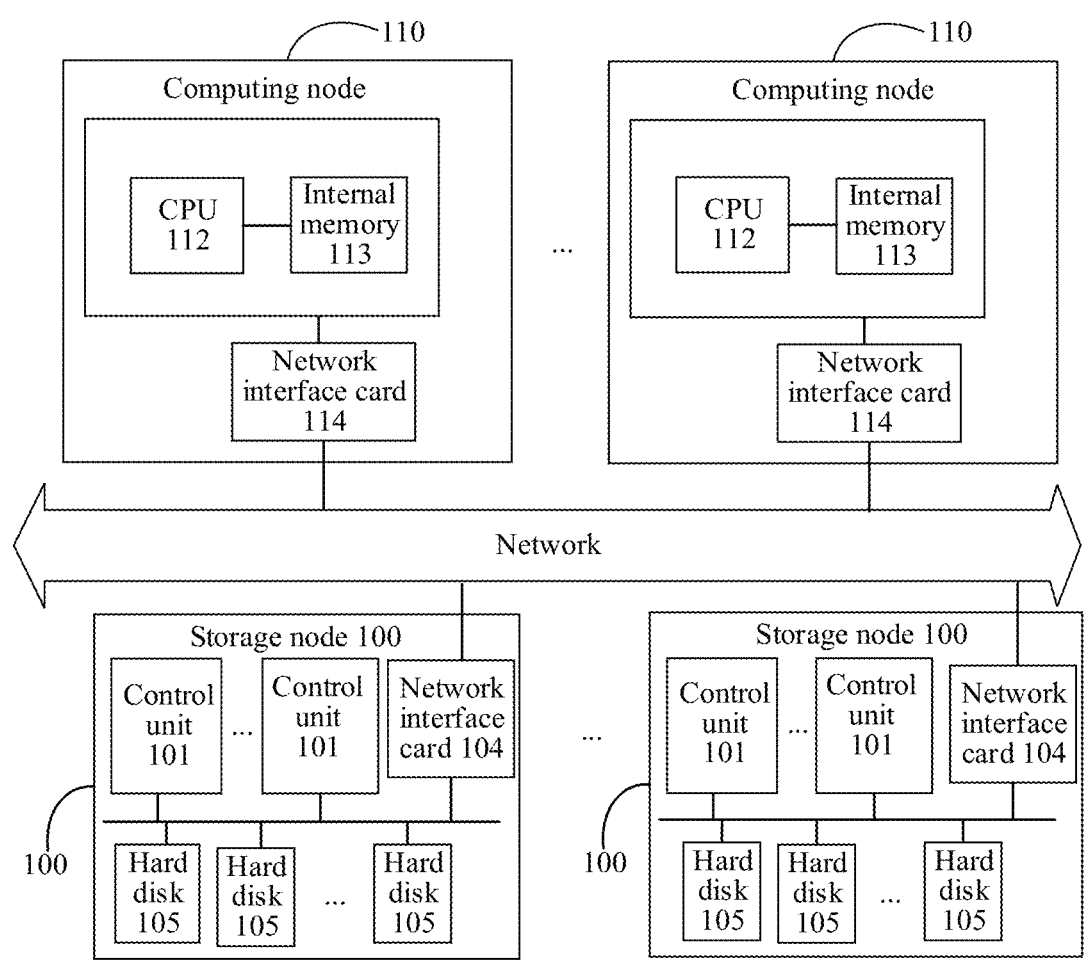

FIG. 2E is a schematic diagram of a system architecture of another distributed storage system according to an embodiment of this application. The system includes a computing node cluster and a storage node cluster. The computing node cluster includes one or more computing nodes 110 (three computing nodes 110 are shown in FIG. 2E, but this application is not limited to the three computing nodes 110), and the computing nodes 110 may communicate with each other. The computing node 110 is a computing device, such as a server, a desktop computer, or a controller of a storage array.

In terms of hardware, as shown in FIG. 2E, the computing node 110 includes at least a processor 112, an internal memory 113, and a network interface card 114. A function of the processor 112 is similar to that of the processor 112 in FIG. 2C or FIG. 2D. For details, refer to the foregoing content. Details are not described herein again. A difference lies in that when a total amount of data in the internal memory 113 reaches a specific threshold, the processor 112 sends data stored in the internal memory 113 to a storage node 100, and hard disks 105 of the storage node 100 perform persistent storage. Correspondingly, when receiving a data read request sent by a user, the processor 112 obtains to-be-read data from the internal memory 113, or obtains the to-be-read data from the storage node 100, and sends the data to the user.

A function and a type of the internal memory 113 are similar to a function and a type of the foregoing internal memory 124. For details, refer to the foregoing content. Details are not described herein again.

The network interface card 114 is configured to communicate with the storage node 100. For example, when a total amount of data in the internal memory 113 reaches a specific threshold, the computing node 110 may send a request to the storage node 100 through the network interface card 114, to perform persistent storage on the data. In addition, the computing node 110 may further include a bus, configured to perform communication between internal components of the computing node 110. In terms of functions, because a main function of the computing node 110 in FIG. 2E is to compute services, and a remote memory may be configured to implement persistent storage when data is stored, the computing node 110 has fewer local memories than a conventional server, thereby reducing costs and space. However, this does not mean that the computing node 110 cannot have a local memory. In actual implementation, the computing node 110 may also have a few built-in hard disks or a few external hard disks.

Any computing node 110 may access any storage node 100 in the storage node cluster through a network. The storage node cluster includes a plurality of storage nodes 100. One storage node 100 includes one or more control units 101, a network interface card 104, and a plurality of hard disks 105. The network interface card 104 is configured to communicate with the computing node 110. The hard disk 105 is configured to store data, and may be a magnetic disk or another type of storage medium, for example, a solid-state drive or a shingled magnetic recording hard disk. The control unit 101 is configured to write data into the hard disks 105 or read data from the hard disks 105 based on a data read/write request sent by the computing node 110. In a process of reading and writing data, the control unit 101 needs to convert an address carried in the data read/write request into an address that can be identified by the hard disk. It can be seen that the control unit 101 also has some simple calculation functions.

Different from the internal memory, a data read/write speed of the hard disk is slower than that of the internal memory, and the hard disk is configured to store data persistently. A type of the hard disk is an SSD, a hard disk drive (HDD), or another type of hard disk. A read/write speed of the SSD is higher than that of the HDD.

The following describes a structure of the SSD.

Figure 3:
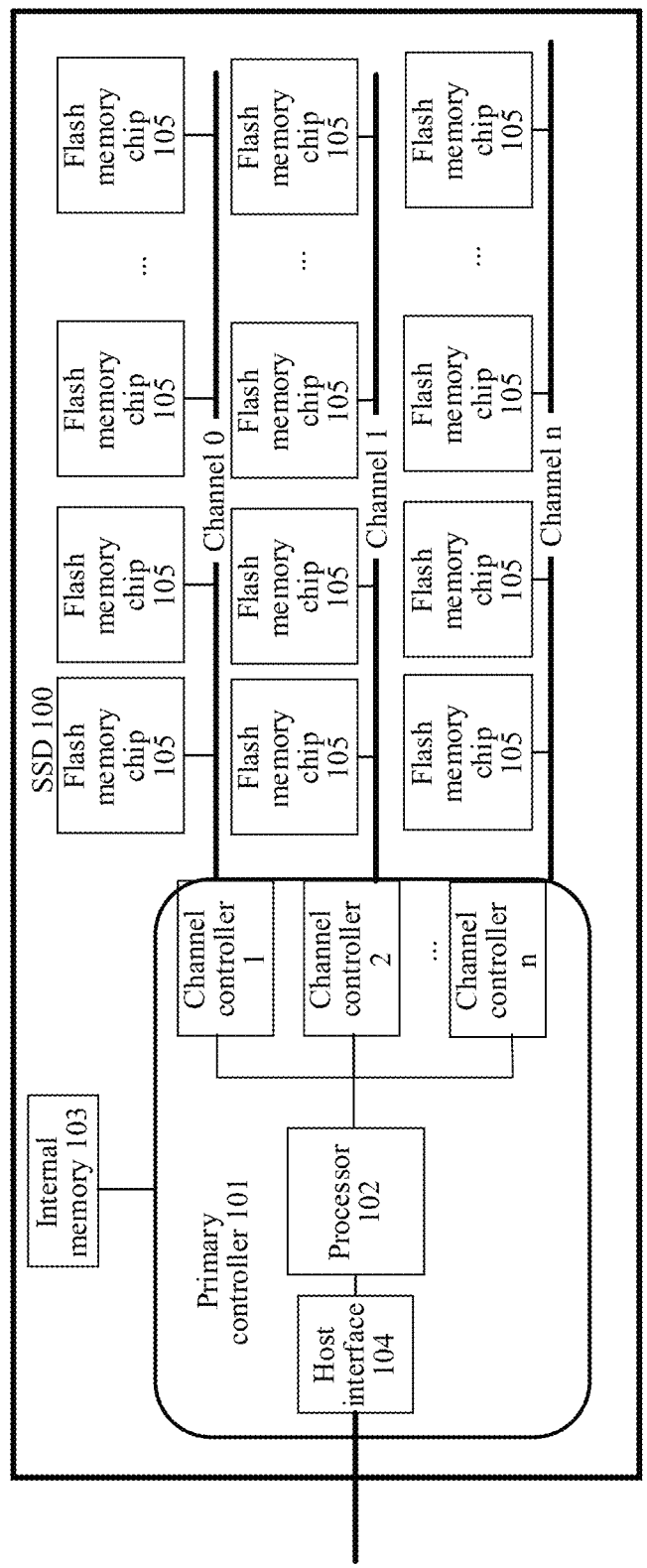
FIG. 3 is a schematic diagram of an architecture of an SSD according to an embodiment of this application.

An SSD is a storage device that uses a flash memory (NAND Flash) as a persistent storage. As shown in FIG. 3, an SSD 100 includes a NAND flash memory and a primary controller (primary controller for short) 101. The NAND flash memory includes a plurality of flash memory chips 105, configured to store data. The primary controller 101 is a brain center of the SSD, and is responsible for some complex tasks, such as managing data storage, and maintaining SSD performance and a service life. The primary controller 101 is an embedded microchip, which includes a processor 102, and a function of the primary controller 101 is like a command center, and sends all operation requests of the SSD. For example, the processor 102 may perform functions such as reading/writing data, garbage collection, and wear leveling through firmware in a buffer.

The primary controller 101 of the SSD further includes a host interface 104 and several channel controllers. The host interface 104 is configured to communicate with a host. The host herein may be any device such as a server, a personal computer, or an array controller. Through the several channel controllers, the primary controller 101 may operate a plurality of flash memory chips 105 in parallel, thereby improving a bandwidth of a bottom layer. For example, assuming that there are eight channels between the primary controller 101 and flash memory chips, the primary controller 101 reads and writes data to eight flash memory chips 105 in parallel via the eight channels.

Figure 4:
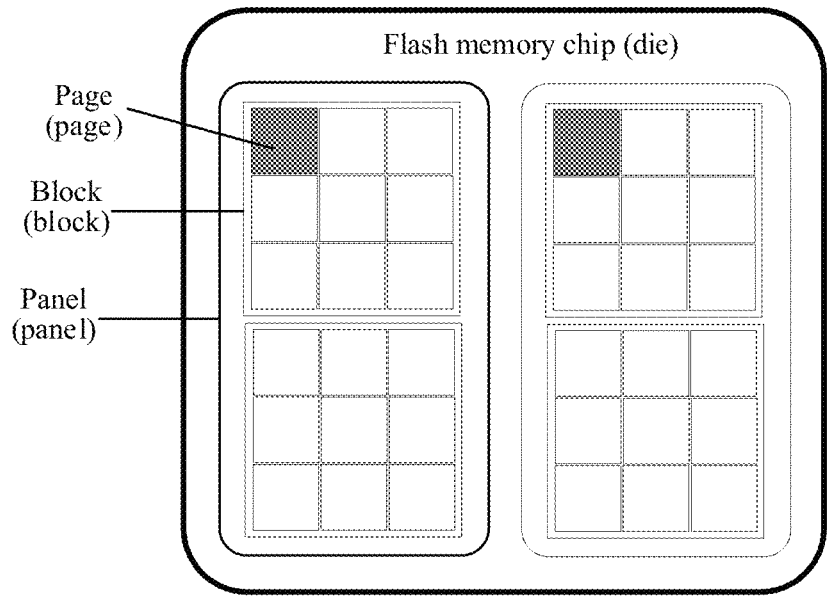
FIG. 4 is a schematic diagram of an architecture of a flash memory chip according to an embodiment of this application.

As shown in FIG. 4, a die (flash memory chip) is a package structure of one or more flash memory chips. One die may include a plurality of panels, and a multi-panel NAND flash is a design that can effectively improve performance. As shown in FIG. 3, one die is divided into two panels, and block numbers in the two panels are single- and dual-crossed. Therefore, during an operation, a single- and dual-cross operation may be performed to improve performance. One panel includes a plurality of blocks. One block includes several pages. Using a flash memory chip having a capacity of 16 GB as an example, every 4314*8=34512 cells logically form a page. Each page may store 4 KB (Kilobyte) content and 218 B error correcting code (ECC) verification data, and the page is also a minimum unit of an I/O operation. Every 128 pages form a block, and every 2048 blocks form a panel. A flash memory chip includes two panels. One panel stores blocks with odd numbers, and the other stores blocks with even numbers. The two panels can be operated concurrently. This is merely an example. A size of a page, a capacity of a block, and a capacity of a flash memory chip may have different specifications. This is not limited in this embodiment.

The host writes data into a block. When the block is full, the primary controller 101 of the SSD selects a next block to continue writing. A page is a minimum unit of data writing. In other words, the primary controller 101 writes data into the block by using a page as a granularity. The block is a minimum unit for data erasure. The primary controller can erase only the entire block at a time.

In this embodiment of this application, when performing compression on a plurality of objects, the server may first determine popularity values of the objects, and sort the plurality of objects in descending order of the popularity values, so that an object having a relatively high popularity value is sorted before an object having a relatively low popularity value, and compress sorted data. In this way, because frequently read hotspot data is sorted ahead, an amplification ratio is reduced when the data is read. In addition, an amplification ratio of reading cold data is approximately the same as that of an existing compression manner. Therefore, an average read amplification ratio is reduced, and system performance is improved.

Figure 5:
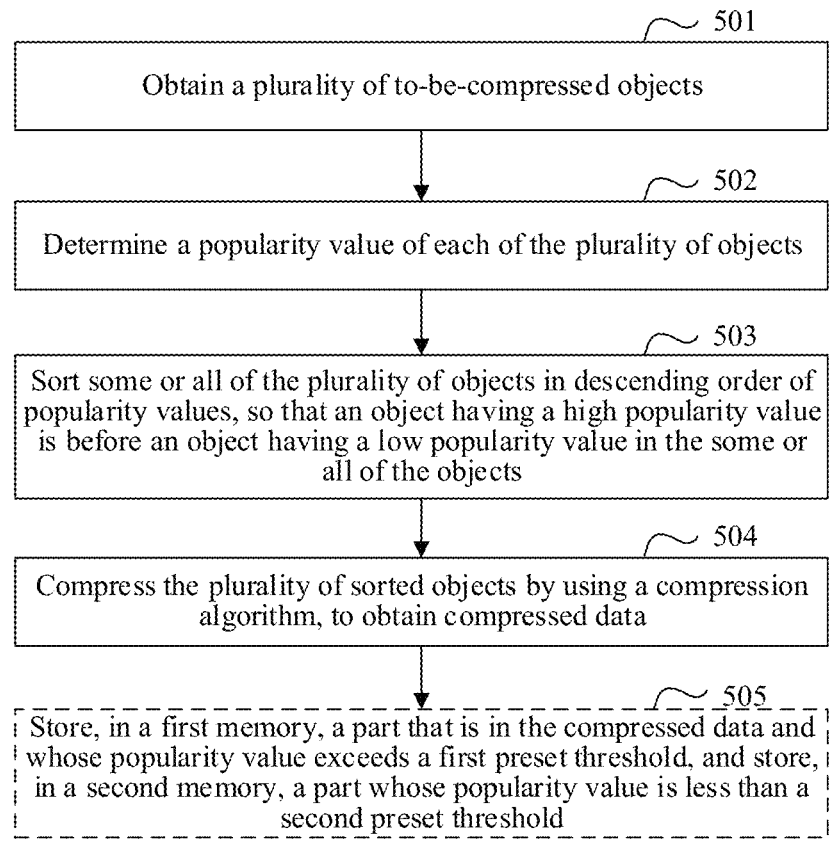
FIG. 5 is a schematic flowchart corresponding to a data processing method according to an embodiment of this application.

With reference to FIG. 5, the data processing method provided in embodiments of this application is applied to the system architectures shown in FIG. 2A to FIG. 2E. The following describes the data processing method provided in embodiments of this application. A server mentioned in the method may be the controllers (for example, the controller 0 and the controller 1) in FIG. 2A and FIG. 2B, or may be the server 110 in FIG. 2C and FIG. 2D, or may be the computing node or the controller 111 in FIG. 2E.

As shown in FIG. 5, the method includes the following steps.

Step 501: A server obtains a plurality of to-be-compressed objects.

The object herein may be one or more types of a file, a document, an image, an audio stream, a video stream, or the like, or may be a data block. An example in which one object is one data block is used for description herein. The data block is a data unit transmitted between an internal memory and an input device, an output device, or a hard disk, and may be a physical data unit. For example, one data block may be one or more blocks or one or more pages. The data block may alternatively be a logical data unit, for example, a 1 KB logical block or an 8 KB logical block. Certainly, values such as 1 KB and 8 KB are merely examples. A size of the logical block is not limited in this embodiment of this application. It should be understood that one data block may include one or more types of a file, a document, an image, an audio stream, a video stream, and the like.

The plurality of to-be-compressed objects herein may be similar data blocks. As described above, a plurality of similar data blocks may be searched for in a manner of similar fingerprints. For example, the process may include: calculating a fingerprint for each data block, where one data block is used as an example; dividing the data block into a plurality of parts; and performing a hash operation on data of each part, where one part corresponds to one hash value, and all hash values of the data block form a fingerprint of the data block. If a fingerprint similarity between two data blocks is high, it indicates that there is a high probability that the two data blocks have similar content. In this application, the server may search for the plurality of similar data blocks in this manner. It should be understood that the manner of searching for the similar data blocks by using similar fingerprints herein is merely an example. This is not limited in this embodiment of this application.

Step 502: The server determines a popularity value of each of the plurality of objects.

The example in which the object is the data block is still used. Herein, statistics on the popularity value may be collected by using the data block as a granularity. For example, statistics on a popularity value of the data block may be collected based on one or more parameters such as time at which data in the data block is accessed and frequency at which the data is accessed. For example, each time the data in the data block is accessed once, the frequency at which the data block is accessed is increased by 1. When the popularity value of the data block indicates the frequency at which the data block is accessed, for example, when the popularity value of the data block is the frequency at which the data block is accessed, higher frequency at which the data block is accessed indicates a higher popularity value of the data block. For another example, when the popularity value of the data block indicates frequency and time at which the data block is accessed, within a specified time, higher recorded frequency at which the data block is accessed indicates a higher popularity value of the data block. The popularity value of the data block is an average popularity value of the data stored in the data block. Certainly, the popularity value of the data block may be alternatively determined by using another algorithm. This is not limited in this embodiment of this application.

Step 503: The server sorts some or all of the plurality of objects in descending order of popularity values, so that an object having a high popularity value in the some or all objects is sorted before an object having a low popularity value.

The example in which the object is the data block is still used. The foregoing step 503 includes two implementation solutions. Solution 1: All data blocks in the plurality of similar data blocks are sorted based on popularity values, so that a data block having a high popularity value is sorted before a data block having a low popularity value. Solution 2: Some data blocks in the plurality of similar data blocks are sorted based on popularity values, and a data block having a high popularity value in the some similar data blocks is sorted before a data block having a low popularity value.

Figure 6:
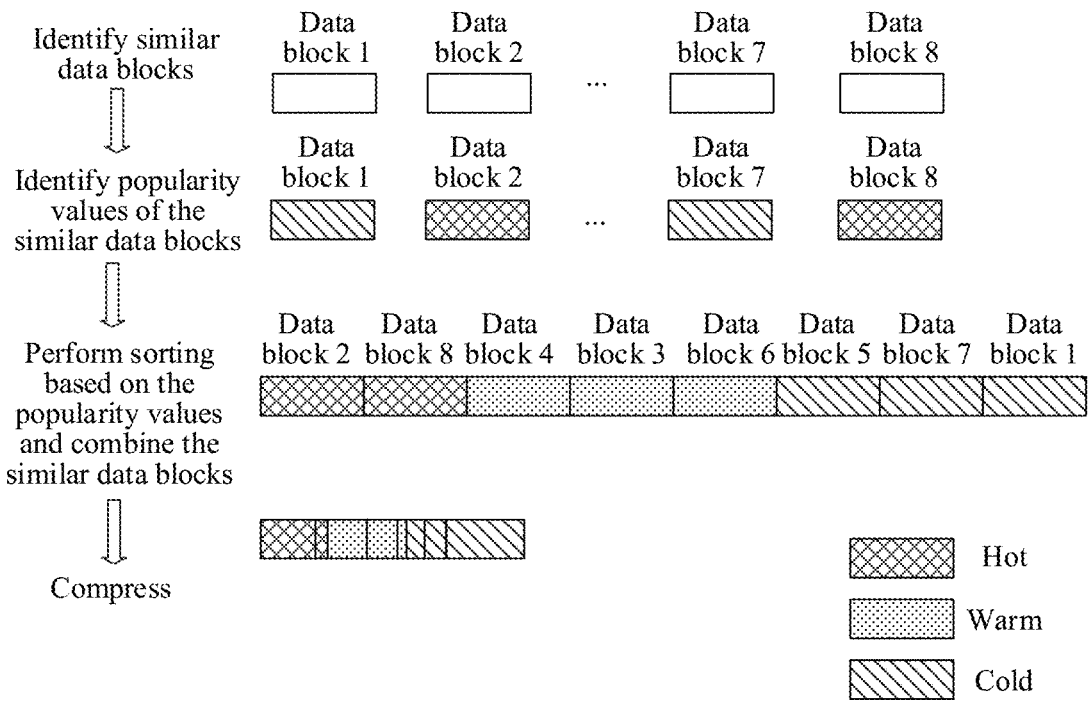
FIG. 6 is a schematic diagram of a scenario of combination compression according to an embodiment of this application.

The following first describes Solution 1. FIG. 6 is a schematic diagram of a scenario of data compression according to an embodiment of this application. As shown in FIG. 6, the plurality of similar data blocks are determined in step 501, and the popularity value of each data block is identified in step 502. Storage space occupied by the plurality of similar data blocks may be continuous or discontinuous. Therefore, optionally, a plurality of discontinuous data blocks may be combined before compression. In other words, the plurality of data blocks are migrated to a segment of continuous storage space. For example, storage space of the plurality of data blocks is discontinuous, and the plurality of data blocks are combined in step 503. As described above, the combination means migrating data in the plurality of data blocks to a piece of continuous storage space. Before the data is migrated, the plurality of data blocks may be sorted in descending order based on the popularity values. In a data migration process, the data blocks are migrated sequentially based on sorting of the popularity values, so that a data block having a high popularity value is sorted before a data block having a low popularity value. FIG. 6 is a schematic diagram of sorting of combined data blocks.

Specifically, in the migration process, an implementation is that a data block having a highest popularity value may not be moved, and other data blocks are sequentially migrated behind the data block having the highest popularity value in descending order of the popularity values, to reduce resource scheduling overheads. However, it should be understood that if there is no sufficient idle storage space after the data block having the highest popularity value, costs of using the method are high. In another possible implementation, a segment of blank continuous storage space (which is denoted as target storage space) may be applied for, and all the data blocks are migrated to the target storage space in descending order of the popularity values. It should be understood that, in this application, the storage space occupied by the plurality of sorted data blocks may be referred to as the target storage space. In this application, data in the target storage space may be compressed.

Solution 1 may be applied to combination compression or delta compression. Generally, in a delta compression technology, a standard data block is usually selected based on a maximum reduction rate, and the standard data block is sorted at a start location. However, in Solution 1, after all similar data blocks are sorted based on the popularity values, a data block having a highest popularity value is sorted at a start location. Therefore, in an implementation, in this embodiment of this application, the data block having the highest popularity value may be used as the standard data block.

Solution 2 is mainly applied to the delta compression. The following describes Solution 2 with reference to the delta compression. A specific process of performing step 503 includes: selecting a standard data block; sorting the standard data block at a start location; sorting remaining data blocks in descending order of popularity values; and sequentially sorting the remaining data blocks after the standard data block. Optionally, in Solution 2, the plurality of data blocks may also be combined. In a migration process, the data blocks are migrated based on sorting of the popularity values.

It should be noted that the popularity value in this embodiment of this application may be a level. For example, if exceeding a first preset threshold, the popularity value is hot; if exceeding a second preset threshold and being less than the first preset threshold, the popularity value is warm; and if being less than the second preset threshold, the popularity value is cold. A plurality of data blocks of a same popularity level may be sorted randomly or in a sequence of finding the data blocks. This is not limited in this embodiment of this application. For another example, the popularity value in this embodiment of this application may alternatively be a specific value. For example, a popularity value range is 1 to 10, or 1 to 100. The plurality of data blocks may be sorted in descending order based on the popularity values.

Step 504: Compress the plurality of sorted objects by using a compression algorithm, to obtain compressed data.

The example in which the object is the data block is still used. For example, the data in the plurality of data blocks may be considered as a whole during compression. For example, byte-by-byte scanning is performed on the data in the whole, data (byte) that appears for the first time is retained in a data sequence, and repeated data (byte) that appears later is compressed. For example, the repeated data that appears later may be replaced with code corresponding to the data. It should be noted that scanning may alternatively be performed at another granularity during compression, for example, a field is used as a granularity. This is not limited in this embodiment of this application. The following uses a byte as an example for description.

Figure 7:
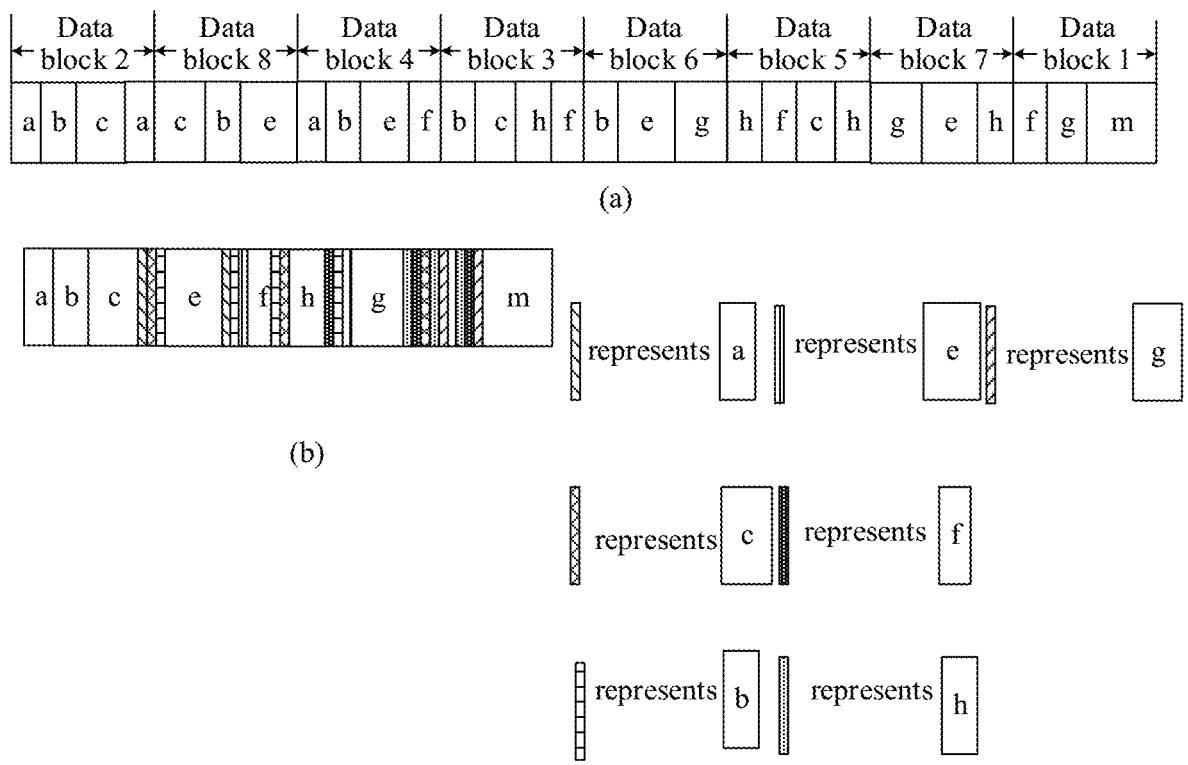
FIG. 7 is a schematic diagram of comparison before and after data compression according to an embodiment of this application.

For example, FIG. 7 is a schematic diagram of comparison before and after data compression. (a) in FIG. 7 is a schematic diagram of internal data of to-be-compressed data blocks. It should be understood that each letter in FIG. 7 represents one byte. It should be understood that there may be repeated data in one data block, and the repeated data in the same data block may also be compressed. In addition, rectangular blocks having different lengths in FIG. 7 merely represent different bytes. Actually, a quantity of bits included in each byte should be the same.

With reference to (a) in FIG. 7, for example, a data compression process may include performing byte-by-byte scanning in a data sorting sequence. First, a byte a is scanned. It may be determined that the byte a is data that appears for the first time, and the byte a is reserved. Then, a byte b is scanned, and the byte b is compared with the byte a. The byte b is data that appears for the first time. In other words, the byte b is not repeated with the byte a. In this case, the byte b is reserved. Similarly, whether a byte c is repeated with the byte a and whether the byte c is repeated with the byte b are determined. If the byte c is not repeated with the byte a and the byte c is not repeated with the byte b, the byte c is reserved. Then, whether a byte a sorted after the byte c is repeated with the previous data is determined. It can be seen that the byte a sorted at the end of a queue in a data block 2 is repeated with the byte a sorted at the beginning of the queue. In this case, the byte a sorted at the end of the queue is replaced with code corresponding to the byte a sorted at the beginning of the queue. Whether a byte c in a data block 8 is repeated with previous data is continuously determined. If the byte c in the data block 8 is repeated with the previous data, the repeated byte c is replaced with code corresponding to the byte c. If the byte c is a byte that appears for the first time, the byte c is reserved. Each subsequent byte is sequentially detected according to the foregoing method, and details are not described herein again. This is not limited in this embodiment of this application. (b) in FIG. 7 is a schematic diagram of compressed data, and storage space occupied by the compressed data is significantly reduced. FIG. 7 is merely an example. In this embodiment of this application, the code may include one or more of parameters such as a number, a letter, a symbol, and a graph. One byte may correspond to one piece of code, or a plurality of bytes may correspond to one piece of code. For example, in (a) in FIG. 7, there are the byte a and the byte b in both the data block 2 and a data block 4. In this case, the byte a and the byte b may be considered as one piece of data and compressed as a whole, and the byte a and the byte b each may be replaced with one piece of code.

It should be noted that the foregoing compression algorithm is merely an example. For example, the compression algorithm may alternatively be a fixed bit length algorithm, an LZ algorithm, or the like. The used compression algorithm is not limited in this embodiment of this application.

It should be understood that, in this embodiment of this application, a mapping relationship between data and code may be stored, to restore data in a data block during data decompression. For example, the mapping relationship may be a correspondence between an identifier of the data and the code, and the identifier of the data is used for uniquely identifying one piece of data. Alternatively, the mapping relationship may be a correspondence between an index of the data and the code. Optionally, metadata of the data (where the metadata includes a storage address of the data)

may be found based on the identifier/index of the data. Alternatively, the mapping relationship may include a correspondence between the metadata of the data and the code. For example, the code of the byte a is "1". In the mapping relationship, the code "1" may correspond to a storage location of the byte a in a data block 1 (namely, metadata of the byte a).

According to the foregoing method, for the plurality of to-be-compressed data blocks, the plurality of data blocks may be sorted in descending order based on popularity values, so that a data block having a relatively high popularity value is sorted before a data block having a relatively low popularity value, and the plurality of sorted data blocks are compressed. In this way, because frequently read hotspot data is sorted ahead, an amplification ratio is reduced when the data is read. In addition, an amplification ratio of reading cold data is approximately the same as that of an existing compression manner. Therefore, storage resource utilization is ensured, and an average read amplification ratio is reduced.

Step 505: Store, in a primary memory, a part that is in the compressed data and whose popularity value exceeds the first preset threshold, and store, in a secondary memory, a part whose popularity value is less than the second preset threshold.

In step 505, grading storage may be performed on the compressed data. Hot data is stored in a memory having high performance, and cold data is stored in a memory having relatively low performance. Details are described below.

In this embodiment of this application, the server may include a plurality of levels of memories, and performance of each level of memory is different. Performance of the memory in this application is mainly considered in terms of an operation speed and/or an access delay. For example, the internal memory described in FIG. 2A includes a DRAM and an SCM, the hard disk includes an HDD and an SSD, and the plurality of memories are sorted based on performance as follows: DRAM>SCM>SSD>HDD.

In an implementation, the compressed data may be stored in the internal memory. For example, in the internal memory, a primary memory may be a DRAM, and a secondary memory may be an SCM. Specifically, a part having a relatively high popularity value in the compressed data may be stored in the DRAM, and a part having a relatively low popularity value in the compressed data may be stored in the SCM.

In another implementation, the compressed data may be stored in the hard disk. For example, in the hard disk, the primary memory may be an SSD, and the secondary memory may be an HDD. Specifically, a part having a relatively high popularity value in the compressed data may be alternatively stored in the SSD, and a part having a relatively low popularity value is stored in the HDD.

In still another implementation, the compressed data may be stored in the internal memory and the hard disk. For example, the primary memory may be an SCM/DRAM, and the secondary memory may be an SSD/HDD. Specifically, a part having a relatively high popularity value in the compressed data may be stored in the SCM/DRAM, and a part having a relatively low popularity value is stored in the SSD/HDD.

The foregoing uses the local memory of the server as an example for description. For another example, for each storage system shown in FIG. 2A to FIG. 2E, a memory pool may be constructed by using a memory resource in a same storage system, and/or a storage pool may be constructed by using a hard disk resource in a same storage system. The storage system shown in FIG. 2D is used as an example to separately describe the memory pool and the storage pool.

Figure 8:
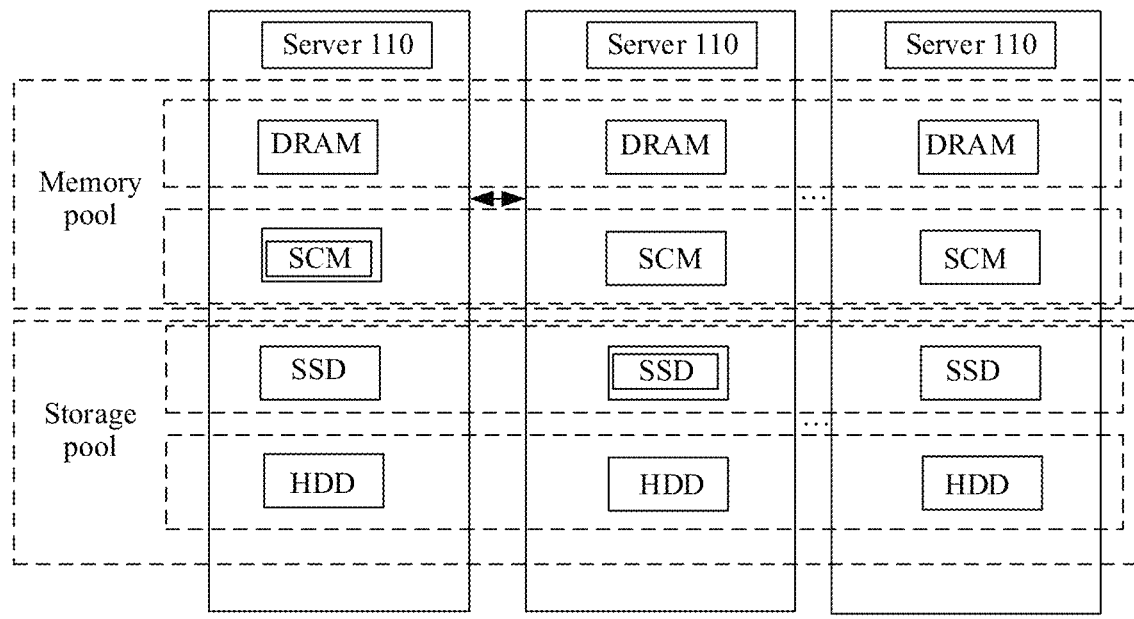
FIG. 8 is a schematic diagram of an architecture of a memory pool and a storage pool according to an embodiment of this application.

The memory pool is first described. FIG. 8 is a schematic diagram of a memory pool constructed in the storage system shown in FIG. 2D. The memory pool may include an internal memory in some or all of the servers 110 in the system shown in FIG. 2D. The memory pool includes a plurality of different types of memories, and each type of memory may be considered as a level. Performance of a memory at each level is different from performance of a memory at another level. FIG. 8 is a schematic diagram of memories at various levels included in the memory pool according to this embodiment. As shown in FIG. 8, the memory pool includes memories in the servers 110, and DRAMs in the servers 110 are located at a first level of the memory pool because the DRAM has highest performance in various types of memories. Performance of an SCM is lower than performance of the DRAM, so that SCMs in the servers 110 are located at a second level of the memory pool. Although only two types of memories are shown in FIG. 8, based on the foregoing descriptions, in product practice, a plurality of different types of memories may be deployed inside the server 110. In other words, various types of internal memories or hard disks may all be a part of the memory pool, and memories of a same type located on different servers 110 belong to a same level in the memory pool. A type of the memory included in the memory pool and a quantity of levels are not limited in this application. The levels of the memory pool are merely internal division and are not perceived by an upper-level application. It should be noted that, although the memories of a same type on the servers 110 are located at the same level, for a specific server 110, performance of using a local DRAM of the server 110 is higher than performance of using a DRAM of another server 110. Similarly, performance of using a local SCM of the server 110 is higher than performance of using an SCM of another server 110, and the like. Therefore, for the server 110, when memory space of a specific level needs to be allocated, local space that is of the server 110 and that belongs to the level is preferentially allocated to a user, and when the local space is insufficient, space of a same level of another server 110 is allocated.

The following describes the storage pool. Still refer to FIG. 8. The storage pool shown in FIG. 8 also spans at least two servers 110, and storage space of the storage pool includes one or more types of hard disks in the at least two servers 110. As shown in FIG. 8, an SSD is located at a first level of the storage pool, and performance of an HDD is lower than that of the SSD. Therefore, the HDD is located at a second level of the storage pool. However, the SSD and the HDD in this embodiment are merely examples for description. The hard disk may further include another type of memory. In this application, the SSD and the HDD are used as examples for description, but it does not indicate that the storage system 120 does not include another type of memory. The storage pool herein is constructed on the server 110. During actual application, in an implementation, the server 110 may be further externally mounted with one or more disk enclosures, and the one or more disk enclosures may also be used for constructing the storage pool. In another implementation, a shared storage pool may be further constructed by using hard disks of a plurality of storage systems. This is not limited in this embodiment of this application.

For the storage system shown in FIG. 8, the server 110 may store the compressed data in the memories at different levels in the memory pool and/or the storage pool. For example, the part having a relatively high popularity value in the compressed data may be stored in any DRAM in the memory pool, and the part having a relatively low popularity value may be stored in any SCM in the memory pool. For another example, the part having a relatively high popularity value in the compressed data may be stored in any SCM in the memory pool, and the part having a relatively low popularity value is stored in any SSD in the storage pool. For still another example, the part having a relatively high popularity value in the compressed data may be stored in any SSD in the storage pool, and the part having a relatively low popularity value is stored in any HDD in the storage pool.

A part related to performing grading processing on the compressed data herein may be divided by using one or more bytes, a sector, a compressed data block, or another unit as a granularity. This is not limited in this embodiment of this application. It should be understood that the compressed data block herein is a logical data block. For example, data that belongs to the data block 2 and the data block 8 in the compressed data shown in (b) in FIG. 7 is stored in the primary memory, and data of the remaining data blocks is stored in the secondary memory.

For example, assuming that a data block is used as a granularity, for compressed data, based on the popularity value of each data block collected in step 502, data of a data block whose popularity value is greater than a first preset threshold may be stored in the primary memory, and data of a data block whose popularity value is less than a second preset threshold is stored in the secondary memory. If grading storage is performed at another granularity, the popularity value of the data block may be recalculated, or calculation may be performed based on the popularity value of the data block determined in step 502.

It should be understood that two levels of memories are used as an example herein for description, that is, compressed data is divided into cold and hot parts for grading storage. In an actual application, the server may further include memories of more than two levels, for example, a tertiary memory or a quaternary memory. In different scenarios, granularities for grading storage of the compressed data may be different. For example, assuming that the storage pool shown in FIG. 8 includes three layers, and assuming that the storage pool includes a cold medium layer, a warm medium layer, and a hot medium layer, hot data (for example, data whose popularity value exceeds the first preset threshold) in the compressed data may be stored at the hot medium layer, cold data (for example, data whose popularity value is less than the second preset threshold) in the compressed data may be stored at the cold medium layer, and warm data (for example, data whose popularity value is less than the first preset threshold and greater than the second preset threshold) in the compressed data may be stored at the warm medium layer.

In the foregoing manner, grading storage of the compressed data can be implemented, and storage resource overheads of a high-performance layer are reduced while an average read amplification ratio is reduced, thereby reducing costs and improving system performance.

It should be noted that step 505 is an optional step, and is not a mandatory step. Therefore, a dashed box is used for representing step 505 in FIG. 5.

The following describes a data decompression process in the data processing method provided in embodiments of this application.

Figure 9:
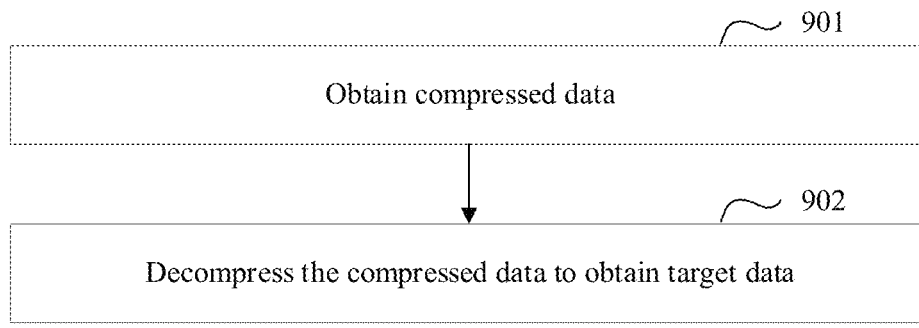
FIG. 9 is a schematic flowchart corresponding to another data processing method according to an embodiment of this application.

FIG. 9 is a schematic flowchart of the data decompression process. A server in FIG. 9 may be the server in the method shown in FIG. 5. As shown in FIG. 9, the method may include the following steps.

Step 901: The server obtains compressed data.

In this application, the server obtains the compressed data in a plurality of manners. For example, the server obtains the compressed data from a local memory, or receives the compressed data sent by another device.

Step 902: The server decompresses the compressed data to obtain target data.

The target data herein may be data that a user requests to access. For example, before step 901, or after step 901, and before step 902, the server may receive a read I/O request sent by the user. Data that is requested to be accessed in the read I/O request is the target data. The server obtains the compressed data, and decompresses the compressed data to obtain the target data. For example, (b) in FIG. 7 is used as an example. If the target data is the data block 8, the data block 2 is first decompressed, and then the data block 8 is decompressed. Then, a storage location of data that corresponds to code in the data block 8 and that is in the data block 2 is determined based on the foregoing mapping relationship, the data is obtained from the data block 2 based on the storage location, and then the obtained data is inserted into a location of the code to restore data of the data block 8 before the data is compressed. A popularity value of the data block 2 is greater than a popularity value of the data block 8. If the target data is the data block 2, only the data block 2 needs to be decompressed.

In this embodiment of this application, when data decompression is performed, a popularity value of a first decompressed part is greater than a popularity value of a subsequent decompressed part, and a probability of accessing data having a relatively high popularity value is relatively high. In this way, because frequently read hotspot data is sorted ahead, an amplification ratio is reduced when the data is read. In addition, an amplification ratio of reading cold data is approximately the same as that of an existing compression manner, and a quantity of times of reading the cold data is small. Therefore, storage resource utilization is ensured, and an average read amplification ratio is reduced.

It should be noted that, in the foregoing descriptions, the data compression process and the data decompression process are both executed by the server. During actual application, the data compression process and the data decompression process may alternatively be executed by different devices. For example, in a data exchange scenario, a first device may perform data compression (step 501 to step 505), and send the compressed data to a second device. After receiving the compressed data, if the second device needs to obtain the target data from the compressed data, the second device may decompress the compressed data (step 901 and step 902), to obtain the target data from the compressed data.

Figure 10:
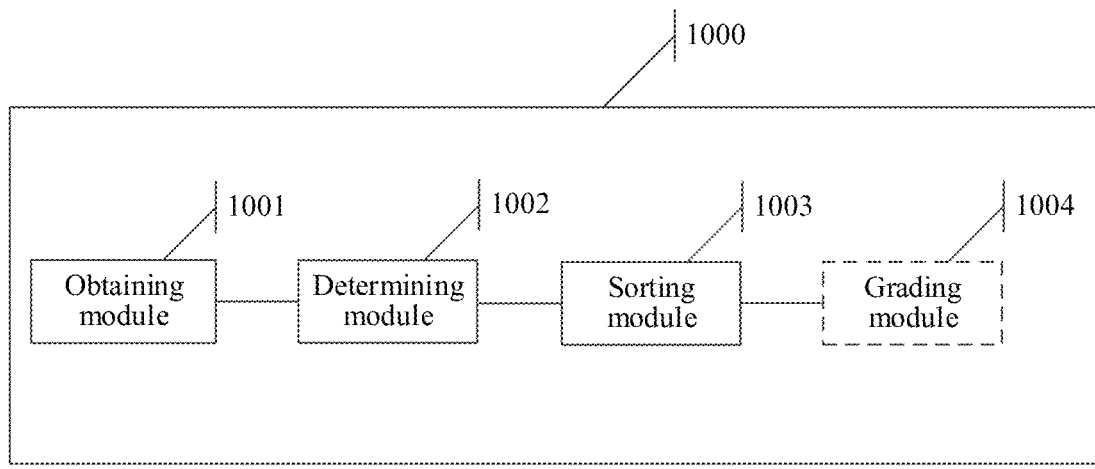
FIG. 10 is a schematic diagram of a structure of a data processing apparatus according to an embodiment of this application.

Based on a same inventive concept as the method embodiments, an embodiment of this application further provides a data processing apparatus. The data processing apparatus is configured to perform the method performed by the server in the method embodiment shown in FIG. 5. FIG. 10 is a schematic diagram of a structure of a data processing apparatus 1000. As shown in FIG. 10, the data processing apparatus 1000 includes an obtaining module 1001, a determining module 1002, and a sorting module 1003, and optionally, further includes a grading module 1004.

The obtaining module 1001 is configured to obtain a plurality of to-be-compressed objects.

The determining module 1002 is configured to determine a popularity value of each object.

The sorting module 1003 is configured to sort the plurality of objects in descending order of popularity values, and compress the plurality of sorted objects.

In a possible implementation, the sorting module 1003 is further configured to combine the plurality of objects, to enable the combined plurality of objects to be continuously stored in a segment of target storage space in descending order of the popularity values.

In a possible implementation, a similarity between every two objects in a plurality of objects exceeds a preset threshold.

In a possible implementation, the similarity is determined by using similar fingerprints of the objects.

In a possible implementation, the apparatus includes at least a primary memory and a secondary memory. Performance of the primary memory is higher than performance of the secondary memory. The grading module 1004 is configured to store, in the primary memory, a part that is in the compressed data and whose popularity value exceeds a first preset threshold, and store, in the secondary memory, a part that is in the second data and whose popularity value is less than a second preset threshold.

Figure 11:
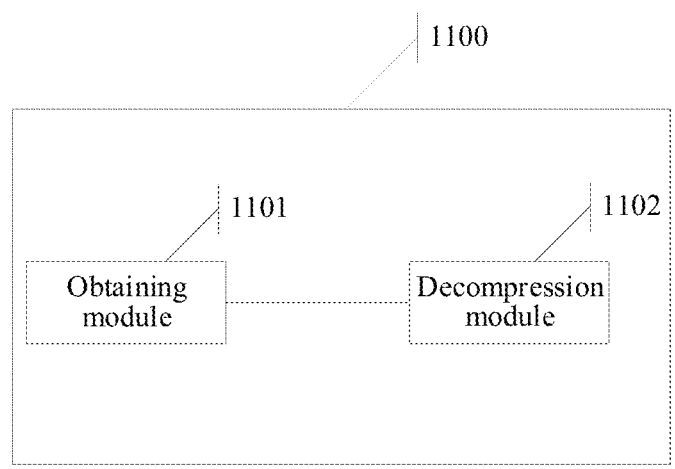
FIG. 11 is a schematic diagram of a structure of another data processing apparatus according to an embodiment of this application.

Based on a same inventive concept as the method embodiment, an embodiment of this application further provides another data processing apparatus. The data processing apparatus is configured to perform the method performed by the server in the method embodiment shown in FIG. 9. FIG. 11 is a schematic diagram of a structure of a data processing apparatus 1100. As shown in FIG. 11, the data processing apparatus 1100 includes an obtaining module 1101 and a decompression module 1102.

The obtaining module 1101 is configured to obtain compressed data, where the data includes at least a first part and a second part.

The decompression module 1102 is configured to decompress the first part; and decompress the second part after decompressing the first part, where a popularity value of the first part is greater than a popularity value of the second part.

In a possible implementation, the popularity value of the first part indicates frequency and/or time at which the first part is accessed, and the popularity value of the second part indicates frequency and/or time at which the second part is accessed.

In a possible implementation, the apparatus includes at least a primary memory and a secondary memory. Performance of the primary memory is higher than performance of the secondary memory. The first part is stored in the primary memory, and the second part is stored in the secondary memory.

Optionally, a computer-executable instruction in embodiments of this application may also be referred to as an application program code. This is not specifically limited in embodiments of this application.

A person of ordinary skill in the art may understand that various numbers such as first and second in this application are merely distinguished for ease of description, and are not intended to limit the scope of embodiments of this application, and indicate a sequence. The term "and/or" describes an association relationship between associated objects and represents that three relationships may exist. For example, A and/or B may represent the following three cases: Only A exists, both A and B exist, and only B exists. A character "/" generally denotes an "or" relationship between the associated objects. "At least one" means one or more. "At least two" means two or more. "At least one", "any one", or a similar expression thereof refers to any combination of these items, including any combination of singular items (pieces) or plural items (pieces). For example, at least one of a, b, or c may indicate: a, b, c, a-b, a-c, b-c, or a-b-c, where a, b, and c may be singular or plural. "A plurality of" means two or more, and other quantifiers are similar. In addition, an element that appears in singular forms "a", "an", and "the" does not mean "one or only one" unless otherwise specified in the context, but means "one or more". For example, "a device" means one or more such devices.

All or a part of the foregoing embodiments may be implemented by software, hardware, firmware, or any combination thereof. When software is used to implement the embodiments, all or a part of the embodiments may be implemented in a form of a computer program product. The computer program product includes one or more computer instructions. When the computer program instructions are loaded and executed on a computer, the procedures or functions according to embodiments of this application are all or partially generated. The computer may be a general-purpose computer, a dedicated computer, a computer network, or any other programmable apparatus. The computer instructions may be stored in a computer-readable storage medium or may be transmitted from a computer-readable storage medium to another computer-readable storage medium. For example, the computer instructions may be transmitted from a website station, a computer, a server, or a data center to another website station, another computer, another server, or another data center in a wired (for example, a coaxial cable, an optical fiber, or a digital subscriber line (DSL)) or wireless (for example, infrared, radio, or microwave) manner. The computer-readable storage medium may be any usable medium accessible by the computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state disk (SSD)), or the like.

The various illustrative logical units and circuits described in embodiments of this application may implement or operate the described functions by using a general purpose processor, a digital signal processor, an application-specific integrated circuit (ASIC), a field programmable gate array (FPGA) or another programmable logical apparatus, a discrete gate or transistor logic, a discrete hardware component, or a design of any combination thereof. The general purpose processor may be a microprocessor. Optionally, the processor may also be any regular processor, controller, microcontroller or state machine. A processor may also be implemented by a combination of computing apparatuses, such as a digital signal processor and a microprocessor, a plurality of microprocessors, one or more microprocessors in combination with one digital signal processor, or any other similar configurations.

Steps of the methods or algorithms described in embodiments of this application may be directly embedded into hardware, a software unit executed by a processor, or a combination thereof. The software unit may be stored in a RAM memory, a flash memory, a ROM memory, an EPROM memory, an EEPROM memory, a register, a hard disk, a removable magnetic disk, a CD-ROM, or a storage medium of any other form in the art. For example, storage medium may be connected to a processor, so that the processor may read information from the storage medium and may save the information in the storage medium. Optionally, the storage medium may be further integrated into the processor. The processor and the storage medium may be disposed in the ASIC.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although this application is described with reference to specific features and the embodiments thereof, it is obvious that various modifications and combinations may be made to this application without departing from the spirit and scope of this application. Correspondingly, the specification and accompanying drawings are merely examples of descriptions of this application defined by the appended claims, and are considered as any or all modifications, variations, combinations, or equivalents that cover the scope of this application. It is clear that, a person skilled in the art can make various modifications and variations to this application without departing from the scope of this application. Therefore, this application is intended to cover these modifications and variations of this application if they fall within the scope of claims of this application and equivalent technologies thereof.

What is claimed is:

1. A data processing method, wherein the method comprises:
   obtaining, by a server, compressed data, wherein the compressed data comprises at least a first part and a second part, and wherein the compressed data is sorted based on popularity values of parts of the compressed data in descending order of popularity values, a higher popularity value of a part of the compressed data indicates a higher frequency at which the part of the compressed data is accessed, and a popularity value of a part of the compressed data is greater than a popularity value of a subsequent part of the compressed data, wherein a popularity value of the first part is greater than a popularity value of the second part, wherein the parts of the compressed data are obtained based on a plurality of to-be-compressed objects, and wherein at least one hash operation is performed on each to-be-compressed object of the plurality of to-be-compressed objects to obtain a fingerprint of the to-be-compressed object, at least one similarity of the plurality of to-be-compressed objects is determined by using fingerprints of the plurality of to-be-compressed objects, and the plurality of to-be-compressed objects are obtained based on the at least one similarity;
   decompressing, by the server, the first part; and
   decompressing, by the server, the second part after decompressing the first part.

2. The method according to claim 1, wherein the popularity value of the first part indicates a time at which the first part is accessed, and the popularity value of the second part indicates a time at which the second part is accessed.

3. The method according to claim 1, wherein the method is applied to a storage device, the storage device comprises at least a primary memory and a secondary memory, and performance of the primary memory is higher than performance of the secondary memory, and wherein the first part is stored in the primary memory, and the second part is stored in the secondary memory.

4. The method according to claim 1, wherein a to-be-compressed object is divided into a plurality of parts of the to-be-compressed object, a hash operation is performed on each part of the plurality of parts of the to-be-compressed object to obtain a corresponding hash value, and hash values of the plurality of parts of the to-be-compressed object are combined to obtain the fingerprint of the to-be-compressed object.

5. The method according to claim 1, wherein a similarity between two to-be-compressed objects is determined to exceed a preset threshold, and the two to-be-compressed objects are included in the plurality of to-be-compressed objects.

6. A data processing method, wherein the method comprises:
   obtaining, by a server, a plurality of to-be-compressed objects, wherein the obtaining comprises:
      performing at least one hash operation on each to-be-compressed object of the plurality of to-be-compressed objects to obtain a fingerprint of the to-be-compressed object;
      determining at least one similarity of the plurality of to-be-compressed objects by using fingerprints of the plurality of to-be-compressed objects; and
      obtaining the plurality of to-be-compressed objects based on the at least one similarity;
   determining, by the server, a popularity value of each to-be-compressed object;
   sorting, by the server and as a plurality of sorted objects, the plurality of to-be-compressed objects in descending order of popularity values, wherein a higher popularity value of a to-be-compressed object indicates a higher frequency at which the to-be-compressed object is accessed; and
   compressing the plurality of sorted objects.

7. The method according to claim 6, wherein the sorting, as a plurality of sorted objects, the plurality of to-be-compressed objects in descending order of popularity values further comprises:
   combining the plurality of to-be-compressed objects, to enable the combined plurality of to-be-compressed objects to be continuously stored in a segment of target storage space in descending order of the popularity values.

8. The method according to claim 6, wherein a similarity between every two to-be-compressed objects in the plurality of to-be-compressed objects exceeds a preset threshold.

9. The method according to claim 6, wherein the obtaining comprises:
   dividing a to-be-compressed object into a plurality of parts of the to-be-compressed object;
   performing a hash operation on each part of the plurality of parts of the to-be-compressed object to obtain a corresponding hash value; and
   combining hash values of the plurality of parts of the to-be-compressed object to obtain the fingerprint of the to-be-compressed object.

10. The method according to claim 6, wherein the obtaining comprises:
    determining that a similarity between two to-be-compressed objects exceeds a preset threshold; and
    including the two to-be-compressed objects in the plurality of to-be-compressed objects.

11. The method according to claim 6, wherein the method is applied to a storage device, the storage device comprises at least a primary memory and a secondary memory, and performance of the primary memory is higher than performance of the secondary memory, and wherein the method further comprises:

storing, in the primary memory, a part that is in compressed data and whose popularity value exceeds a first preset threshold; and storing, in the secondary memory, a part that is in the compressed data and whose popularity value is less than a second preset threshold.

12. A data processing apparatus, wherein the apparatus comprises at least one processor, and one or more memories coupled to the at least one processor and storing programming instructions for execution by the at least one processor to perform operations comprising:

obtaining a plurality of to-be-compressed objects, wherein obtaining the plurality of to-be-compressed objects comprises:

performing at least one hash operation on each to-be-compressed object of the plurality of to-be-compressed objects to obtain a fingerprint of the to-be-compressed object;

determining at least one similarity of the plurality of to-be-compressed objects by using fingerprints of the plurality of to-be-compressed objects; and obtaining the plurality of to-be-compressed objects based on the at least one similarity;

obtaining, by a server, compressed data, wherein the compressed data comprises at least a first part and a second part, and wherein the compressed data is sorted based on popularity values of parts of the compressed data in descending order of popularity values, a higher popularity value of a part of the compressed data indicates a higher frequency at which the part of the compressed data is accessed, and a popularity value of a part of the compressed data is greater than a popularity value of a subsequent part of the compressed data, and wherein a popularity value of the first part is greater than a popularity value of the second part;

decompressing, by the server, the first part; and decompressing, by the server, the second part after decompressing the first part.

13. The data processing apparatus according to claim 12, wherein the popularity value of the first part indicates at least one of frequency or time at which the first part is accessed, and the popularity value of the second part indicates at least one of frequency or time at which the second part is accessed.

14. The data processing apparatus according to claim 12, wherein the data processing apparatus further comprises at least a primary memory and a secondary memory, and performance of the primary memory is higher than performance of the secondary memory, and wherein the first part is stored in the primary memory, and the second part is stored in the secondary memory.

15. The data processing apparatus according to claim 12, wherein the operations further comprise:

determining a popularity value of each to-be-compressed object;

sorting, as a plurality of sorted objects, the plurality of to-be-compressed objects in descending order of popularity values; and compressing the plurality of sorted objects.

16. The data processing apparatus according to claim 15, wherein the sorting, as a plurality of sorted objects, the plurality of to-be-compressed objects in descending order of popularity values further comprises:

combining the plurality of to-be-compressed objects, to enable the combined plurality of to-be-compressed objects to be continuously stored in a segment of target storage space in descending order of the popularity values.

17. The data processing apparatus according to claim 16, wherein a similarity between every two to-be-compressed objects in the plurality of to-be-compressed objects exceeds a preset threshold.

18. The data processing apparatus according to claim 16, wherein the data processing apparatus further comprises at least a primary memory and a secondary memory, and performance of the primary memory is higher than performance of the secondary memory, and wherein the operations further comprise:

storing, in the primary memory, a part that is in the compressed data and whose popularity value exceeds a first preset threshold; and storing, in the secondary memory, a part that is in the compressed data and whose popularity value is less than a second preset threshold.

19. The data processing apparatus according to claim 12, wherein obtaining the plurality of to-be-compressed objects comprises:

dividing a to-be-compressed object into a plurality of parts of the to-be-compressed object;

performing a hash operation on each part of the plurality of parts of the to-be-compressed object to obtain a corresponding hash value; and combining hash values of the plurality of parts of the to-be-compressed object to obtain the fingerprint of the to-be-compressed object.

20. The data processing apparatus according to claim 12, wherein obtaining the plurality of to-be-compressed objects comprises:

determining that a similarity between two to-be-compressed objects exceeds a preset threshold; and including the two to-be-compressed objects in the plurality of to-be-compressed objects.

* * * * *